United States Patent [19]

Frosien et al.

[11] 4,219,719
[45] Aug. 26, 1980

[54] METHOD AND APPARATUS FOR AUTOMATICALLY POSITIONING A WORKPIECE RELATIVE TO A SCANNING FIELD OR MASK

[75] Inventors: Jürgen Frosien, Berlin, Fed. Rep. of Germany; Helmut Reschke, deceased, late of Berlin, Fed. Rep. of Germany, by Paul Reschke and Flora Reschke, administrators

[73] Assignee: Siemens Aktiengesellschaft, Munich, Fed. Rep. of Germany

[21] Appl. No.: 912,982

[22] Filed: Jun. 6, 1978

[30] Foreign Application Priority Data

Jun. 8, 1977 [DE] Fed. Rep. of Germany ....... 2726173

[51] Int. Cl.$^2$ .................. B23K 15/00; B23K 26/00; G05B 1/00
[52] U.S. Cl. .................. 219/121 EM; 219/121 EB; 219/121 LM; 250/202; 356/401
[58] Field of Search .................. 219/121 EB, 121 EM, 219/121 L, 121 LM; 250/202; 356/400, 401

[56] References Cited

U.S. PATENT DOCUMENTS

| | | | |
|---|---|---|---|
| 3,519,788 | 7/1970 | Hatzakis | 219/121 EM |
| 3,598,978 | 8/1971 | Rempert | 250/202 X |
| 3,644,700 | 2/1972 | Kruppa et al. | 219/121 EB |
| 3,873,802 | 3/1975 | Sciaky | 219/121 EB |
| 3,901,814 | 8/1975 | Davis et al. | 219/121 EB X |
| 4,152,599 | 5/1979 | Frosien | 250/492 A X |

OTHER PUBLICATIONS

*IBM Technical Disclosure Bulletin*, vol. 17, No. 10, 3/75, 2-D Array Solid-State Feedback Automatic Wafer Alignment System, H. A. Khoury, pp. 2890-2892.

*Primary Examiner*—B. A. Reynolds
*Assistant Examiner*—Keith E. George
*Attorney, Agent, or Firm*—Kenyon & Kenyon

[57] ABSTRACT

A method for automatically positioning a workpiece having at least one marking, specifically a wafer for integrated circuits which is to be processed in a charged-particle beam apparatus, relative to a scanning field or mask. In the method, a scanning beam scans the workpiece along the line and a marking signal is generated when the marking is reached by the beam. This marking signal controls a device which generates a control signal in response to the marking signal which is proportional to the deviation of the marking position from a reference position and which drives a device for correcting the position of the workpiece relative to the scanning field or mask. The improvement of the invention comprises the steps of scanning the beam across the workpiece successively in opposite directions at the same velocity through a forward sweep and a return sweep of the beam; integrating a positive reference voltage in an integrator during the forward sweep of the beam from the beginning of the line scanned until the marking on the workpiece is reached by the beam; integrating a negative reference voltage having the same magnitude as the positive reference voltage in the integrator during the return sweep of the beam from the end of the line scanned by the beam until the marking on the workpiece is reached by the beam; and generating an output control signal by means of the integrator after a full forward and return sweep of the scanning beam over the workpiece for correcting the position of the workpiece relative to the scanning field or mask.

A method using digital scanning and apparatus for carrying out the methods are also disclosed.

10 Claims, 11 Drawing Figures

METHOD AND APPARATUS FOR AUTOMATICALLY POSITIONING A WORKPIECE RELATIVE TO A SCANNING FIELD OR MASK

BACKGROUND OF THE INVENTION

1. Field of the Invention

The present invention relates to a method for automatically positioning a workpiece provided with at least one marking, particularly a wafer for integrated circuits which is to be processed in a charged-particle beam apparatus, relative to a scanning field or a mask, in which a scanning beam scans the workpiece to be aligned along a line, i.e., a line scan, and controls a device when the marking is reached, which thereby generates a control signal which is proportional to the deviation of the marking position from a reference position and which drives a device for correcting the position of the workpiece relative to either the scanning field or the mask.

2. Description of the Prior Art

In the charged-particle lithographic fabrication of structures on semiconductor workpieces (wafers), it is necessary to align the workpiece relative to either the structure-generating charged-particle beam or a mask. This is particularly necessary if in multi-layer processes, the individual details of the structure must be superimposed on each other in precise registration. With advancing miniaturization of structures, the requirements for positioning accuracy have increased. For a largely mechanized manufacturing process, automatic positioning methods are therefore of special interest.

An automatic positioning method is already known in the art in which a workpiece provided with markings is scanned by a focussed electron beam along individual lines. See U.S. Pat. No. 3,644,700. A signal generated by the interaction of the electron beam with the surface of the workpiece, for example, secondary electrons, is registered and transformed in signal modification electronics, for example, a threshold discriminator, into a positioning signal which is suitable for further processing. Through the unequivocal correlation between the positioning signal and the space coordinate of the marking on the workpiece by means of the deflection parameters of the electron beam (for example, the deflection voltage or deflection current), the position of the marking on the line scanned is determined by means of a computer. Through comparison with a reference position, the computer generates a control signal proportional to the deviation from this reference position. This control signal then functions to drive appropriate correction elements, for example, an additional deflection system, for correcting the workpiece position.

The disadvantage of the foregoing method is that it requires a considerable amount of electronic circuitry, since the controlled variable must be determined by a computer. In addition, the control signal is not available immediately after a sweep of the scanning electron beam but only after the computer determination is coupled.

In another known automatic positioning method, a square marking is scanned by a fine electron beam probe along a sinusoidal path. See U.S. Pat. No. 3,519,788. The path followed during scanning in this method is one in which the probe leaves the marking during the positive as well as the negative half-wave. Because of the different secondary electron yields on the marking and the remainder of the workpiece, due to different materials, a distinct jump occurs in the magnitude of the positioning signal between locations on the marking and its environment. During the sweep of the beam through a sine wave, two signal jumps are thus generated which correspond to the areas of the path in which the electron beam leaves the square marking. The widths of the signal jumps during the positive and negative half-waves are a measure of the position of the marking relative to the scanning field. Only if the marking is aligned will both jumps be equal. In order to automate this method, the signals generated during the two half-waves are transmitted to a differential amplifier in which rectified values of the signals are subtracted. The d-c voltage so obtained functions as the control signal by means of which the marking can be centered.

While the electronic circuitry for this method is simpler than for the method described previously herein, it is very sensitive to interference. Since the control signal is obtained in practice by integration of the positioning signal, fluctuations in this signal, such as those caused, for example, by dirt on the workpiece or the marking or by fluctuations in the beam current of the scanning electron beam probe, have a pronounced effect. Any deviation of the positioning signal from the ideal signal generates a contribution to the control signal and therefore causes a positioning error.

Due to the sinusoidal scanning of the marking, there is in addition no linear relation in this method between the control signal and the workpiece position deviation. Several sweeps of the workpiece are accordingly necessary to orient the workpiece marking perpendicular to the direction of propagation of the scanning electron beam probe to the center of the raster area, the reference position.

SUMMARY OF THE INVENTION

It is therefore an object of the present invention to provide an improved method and apparatus for automatically positioning a workpiece having at least one marking which enable the generation of a control signal, which is immediately available after each scan of the beam and has a linear relationship to the position deviation of the workpiece, with a minimum of electronic circuitry and which are insensitive to intensity fluctuations of the positioning signal generated.

These and other objects of the invention are achieved in a method for automatically positiong a workpiece having at least one marking, specifically a wafer for integrated circuits which is to be processed in a charged-particle beam apparatus, relative to a scanning field or mask, in which a scanning beam scans the workpiece along a line and a marking signal is generated when the marking is reached by the beam. The marking signal controls a device which generates a control signal in response to the marking signal which is proportional to the deviation of the marking position from a reference position and which drives a device for correcting the position of the workpiece relative to the scanning field or mask. The improvement of the invention comprises the steps of scanning the workpiece by the scanning beam successively in opposite directions at the same velocity through a forward sweep and a return sweep; integrating a positive reference voltage in an integrator during the forward sweep of the beam from the beginning of the line scanned until the marking on the workpiece is reached by the beam; integrating a negative reference voltage having the same magnitude as the positive reference voltage in the integrator during the return sweep of the beam from the end of the line scanned by the beam until the marking on the workpiece is reached by the beam; and generating an output signal by means of the integrator after a full forward and return sweep of the scanning beam over the workpiece for correcting the position of the workpiece relative to the scanning field or mask.

The objects of the invention are also achieved in a method of the foregoing type in which the improvement comprises the steps of digitally scanning the workpiece by the scanning beam successively in opposite directions through a forward sweep and a return sweep in equidistant steps; counting the scanning steps of the beam in a bidirectional counter at the beginning of each line scanned during the forward sweep of the beam until the marking on the workpiece is reached by the beam, and down-counting the scanning steps in the counter from the end of each line scanned during the return sweep of the beam until the marking on the workpiece is reached; and transmitting the final count of the counter after a full forward and return sweep of the scanning beam to a digital-to-analog converter and generating an output control signal by means of the converter in response to the count for correcting the position of the workpiece relative to the scanning field or mask.

The foregoing objects are also achieved in an apparatus for automatically positioning a workpiece having at least one marking, specifically a wafer for integrated circuits which is to be processed in a charged-particle beam apparatus, relative to a scanning field or mask, which workpiece is scanned by a scanning beam along a line and a marking signal is generated when the marking is reached by the beam. The marking signal controls a device which generates a control signal in response to the marking signal which is proportional to the deviation of the marking position with respect to a reference position and which drives a device for correcting the position of the workpiece relative to the scanning field or mask. The apparatus comprises a triangle wave signal generator; a beam deflection system coupled to the triangle wave signal generator for deflecting the scanning beam; a square wave signal generator coupled to the triangle wave signal generator; first and second d.c. voltage sources for generating first and second d.c. voltages having the same magnitude but opposite polarity; first and second bistable multivibrators coupled to the square wave signal generator; first and second switch means coupled to the first and second d.c. voltage sources and adapted to be controlled by the first and second bistable multivibrators; an integrator coupled to the first and second d.c. voltage sources by means of the first and second switch means; first and second series-connected monostable multivibrators coupled to the square wave signal generator; third and fourth switch means coupled to the integrator and adapted to be controlled by the series-connected monostable multivibrators so as to briefly close sequentially after each sweep of the scanning beam across the workpiece and first couple an output terminal of the integrator to a storage control device coupled thereto which generates an output control signal for correcting the position of the workpiece and subsequently short-circuit the integrator, the monostable multivibrators causing the triangle wave signal generator to generate a signal for another sweep of the beam simultaneously with the short-circuiting of the integrator; a detector for registering the marking signal; a preamplifier coupled to the detector; and a comparator coupled to the preamplifier and to the first and second bistable multivibrators, the comparator being further coupled to means for setting a trigger threshold for the comparator including a reference voltage source and a voltage divider, the preamplifier and the comparator transforming the marking signal into a control signal for controlling the first and second bistable multivibrators.

The objects of the invention are further achieved in an apparatus of the foregoing type comprising a digital signal generator; a digital-to-analog converter coupled to the digital signal generator; a beam deflection system coupled to the digital-to-analog converter for deflecting the beam in a linear scan across the workpiece in equidistant steps; a square wave signal generator coupled to the digital signal generator; a bidirectional counter, coupled to the square wave signal generator and to the digital signal generator, for counting the scanning steps of the beam, the square wave generator controlling the direction and the start of counting by the bidirectional counter; a control device coupled to the square wave signal generator, the digital signal generator, and the counter; switch means coupled to the counter and adapted to be controlled by the control device, the control device closing the switch means after each full forward and return sweep of the scanning beam; a storage control device, coupled to the switch means, the final count of the counter being transmitted to the storage device when the switch means is closed by the control device; a digital-to-analog converter, coupled to the storage control device, for generating an output control signal in response to the final count of the counter and correcting the position of the workpiece, the control device resetting the counter to zero after the final count of the counter is transmitted to the storage control device and restarting the digital signal generator for another sweep of the scanning beam; a detector for registering the marking signal; a preamplifier coupled to the detector; and a comparator coupled to the preamplifier and to the counter, the comparator being further coupled to means for setting a trigger threshold for the comparator including a reference voltage source and a voltage divider, the preamplifier and the comparator transforming the marking signal into a control signal for stopping the counter.

In a preferred embodiment of the apparatus of the invention, the means for setting the trigger threshold of the comparator further includes first and second capacitors; a bistable multivibrator coupled to the capacitors and to the square wave signal generator; a plurality of switch means adapted to be controlled by the bistable multivibrator and coupled to the detector and the voltage divider, the bistable multivibrator connecting the plurality of switch means alternately during one beam sweep to the detector and to the voltage divider; first and second monostable multivibrators coupled to the bistable multivibrator; and first and second switch means coupled to the capacitors and adapted to be controlled by the monostable multivibrators for short-circuiting the capacitors. In this embodiment of the apparatus of the invention, the trigger threshold of the comparator is no longer predetermined by a fixed reference voltage and voltage divider, but rather is fixed in each beam sweep as a fraction of the maximum of the positioning signal.

The method of the invention is particularly useful for use in a charged-particle beam writer, a charged-particle beam microprojector, and a charged-particle beam shadow projector. In the latter apparatus, the length of the line scanned by the beam is determined by the size of an adjustment opening in a mask in the apparatus.

These and other novel features and advantages of the invention will be described in greater detail in the following detailed description.

BRIEF DESCRIPTION OF THE DRAWINGS

In the drawings, wherein similar reference numerals denote similar elements throughout the several views thereof:

FIG. 1b is a signal diagram illustrating the shape of the positioning signal generated by the scanning path illustrated in FIG. 1a;

FIG. 2a is a signal diagram illustrating the positioning signal generated by scanning a workpiece having a marking in the manner illustrated in FIG. 1a;

FIG. 2b is a signal diagram illustrating the rectangular positioning signal generated in the method according to the present invention;

FIGS. 2c, 2d, 2e and 2f are signal diagrams illustrating the different distance and time difference measurements obtained in the method according to the present invention;

DETAILED DESCRIPTION

In accordance with the method of the invention, the workpiece is scanned by the scanning beam successively in opposite directions at the same velocity through a forward and a return sweep; a positive d-c reference voltage is integrated during the forward sweep from the beginning of the line scanned until the marking is reached and a negative reference voltage of the same magnitude as the positive reference voltage is integrated during the return sweep from the end of the line scanned until the marking is reached; and after a full forward and return sweep of the scanning beam, the output signal of an integrator which integrates the reference voltages is used as the control signal for correction of the position of the workpiece.

In the method of the invention, the center of the scanned line is the correct position of the workpiece marking. It is evident that the marking and also the line which is scanned need not be located in the center of the workpiece and that the marking will be located in an edge area of the workpiece which is not required for the fabrication of the electronic components. In order to effect positioning, the beam is deflected into the vicinity of the marking by an additional constant excitation of the deflection system. Subsequently, the beam is scanned over the marking along a line at the same velocity in two directions. The length of the line can then be much smaller than, for example, the extent of the scanning field in a charged-particle beam recorder in the same direction.

The basic principle of the method of the invention is a distance measurement between the marking and the two ends of the scanned line. If the marking is aligned exactly, these two distances are equal. If the marking is not positioned correctly, the difference between the two distances is equal to twice the amount of the distance of the mark from its desired position.

Figure 1A:
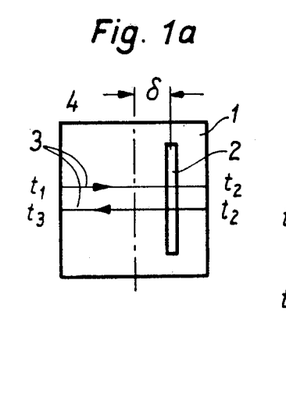
FIG. 1a is a plan view illustrating the path of the scanning beam in the method according to the present invention.
Figure 1B:
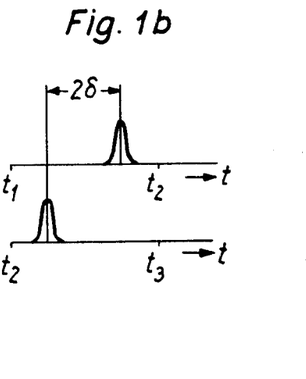

FIGS. 1a and 1b illustrate the path of the scanning beam with respect to time and the corresponding shape of the positioning signal. In FIG. 1a, an area 1 on the surface of the workpiece contains a marking 2 and has a width which is equal to the length of the line along which the scanning beam sweeps over the marking. The marking is displaced to the right by the distance $\delta$ located next to the center of area 1 indicated by the dashed line 4 in the drawings. In this embodiment, the scanning beam 3 starts at time $t_1$ at the left edge of area 1, sweeps over this area until time $t_2$, and returns to its starting point along the same path until time $t_3$. For the sake of clarity, the forward and return paths have been shown in FIG. 1a positioned one below the other.

This sweeping of the scanning beam uniformly back and forth across area 1 generates a positioning signal which when plotted in only one direction has a signal waveform of the type shown in FIG. 1b. A marking located on the right half of the scanning line also appears during the forward sweep of the beam to the right of the center of the time plot of the positioning signal. During the return sweep, the conditions are reversed. The distance difference $2\delta$ from the start to a point of the marking signal between the forward and the return sweep or, being equivalent thereto, the time difference from the start until this point is reached between the forward and the return sweep, is an indication of the position of the marking with respect to the line scanned.

The actual measurement of the above-described distance or time difference is accomplished by integration of a constant reference voltage. The integration begins at the start of the line to be scanned and ends when the marking is reached. The integration value so obtained is then stored for the remainder of the forward sweep of the beam. During the return sweep, a negative reference voltage of the same magnitude is integrated from the end of the line scanned until the marking is reached. The integration value obtained is stored until the end of the return sweep. The polarity of this signal is a measure of the deviation of the marking from the center of the line scanned and can be used directly as the control signal. The control signal is a linear function of the position deviation.

By using a constant reference voltage for generating the control signal, disturbances of the positioning signal no longer have an effect, contrary to the method described in U.S. Pat. No. 3,519,788.

In another embodiment of the method of the invention, a rectangular positioning signal, the width of which depends on the setting of a trigger threshold, is generated from the marking signal and an indication is given that the marking has been reached by the flanks of the rectangular positioning signal. In this case, only the edge of the marking, which is indicated by a jump of the positioning signal formed, is used to terminate the integration, whereby the interference influence of the control signal by the positioning signals is still further reduced.

Figure 2:
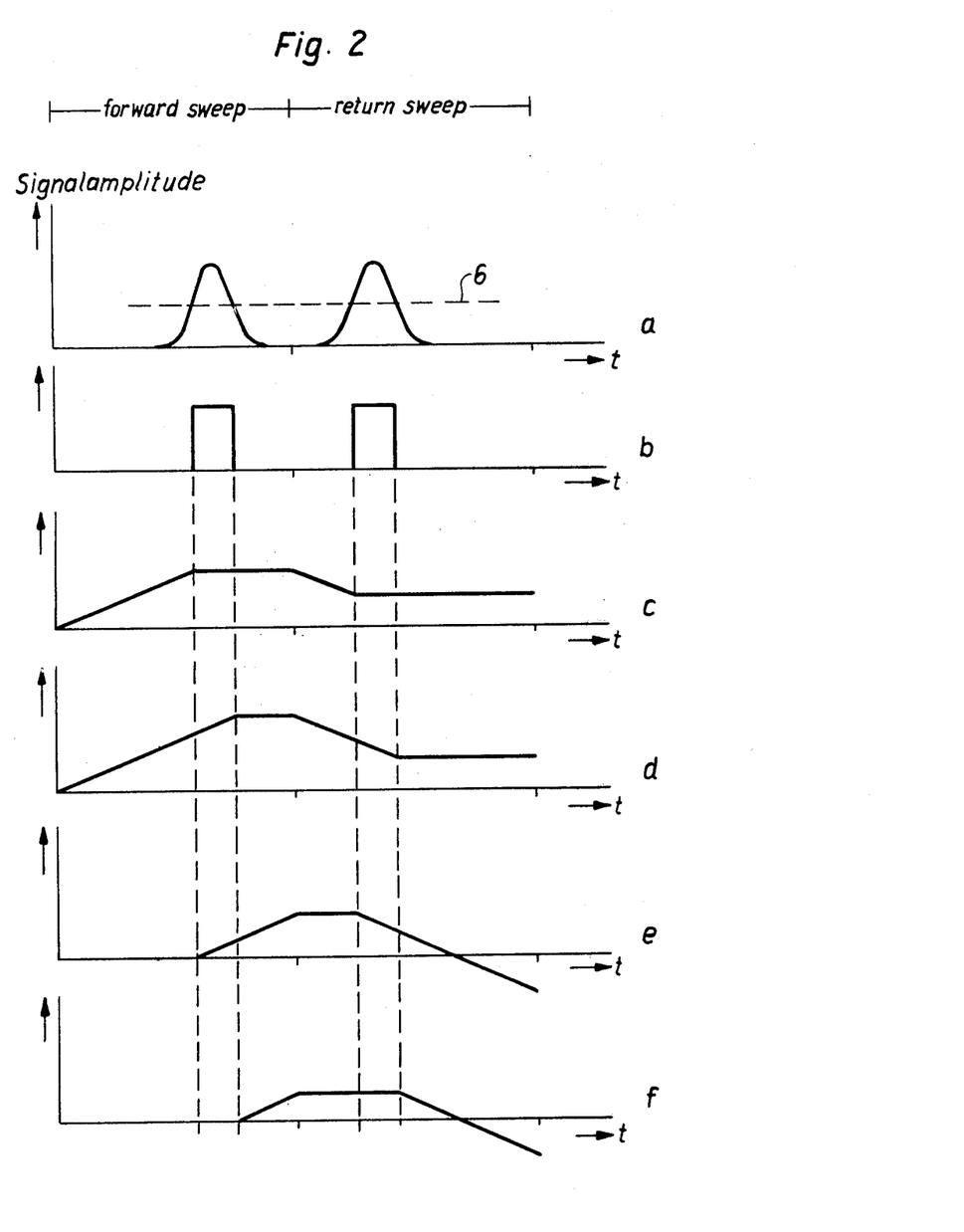

The method of the invention will now be described in greater detail with reference to the signal diagrams illustrated in FIGS. 2a through 2f. FIG. 2a shows the positioning signal for a forward and return sweep which is generated by a marking of the type illustrated in FIG. 1. The bell shape of the positioning signal in the region of the marking is explained by the fact that the scanning beam, i.e., the probe, is not a point but has an area. The dashed line 6 represents the adjustable trigger threshold, the intersections of which with the marking signals form transition points for the rectangular positioning signal, as shown in FIG. 2b.

FIGS. 2c through 2f show four different distance or time difference measurements. In FIG. 2c, the integration begins with the start of the forward sweep of the scanning beam at the beginning of the line scanned and ends when the rising flank of the positioning signal is reached. In FIG. 2d, the integration ends when the falling flank of the positioning signal is reached. These integration values are then stored during the remainder of the forward sweep. At the beginning of the return sweep, i.e., at the end of the line scanned, the negative reference voltage of the same magnitude is integrated until the rising flank (FIG. 2c) or the falling flank (FIG. 2d) of the positioning signal is reached. The overall integration value reached is stored until the end of the sweep and can then be used directly as the control signal. The integration may also be started at a flank of the positioning signal and terminated at the end of the forward or return sweeps, respectively, as shown in FIGS. 2e and 2f.

In order to increase the insensitivity to interference of the control signals with respect to fluctuations of the positioning signal, which can be caused, for example, by current fluctuations or drift phenomena, the trigger threshold in the embodiment of the method just explained may be fixed as a fraction of the maximum of the marking signal and redetermined during each beam scan for the next beam sweep. This can be accomplished, for example, by using a peak detector. During a first sweep, the maximum of the positioning signal is determined and the trigger threshold is set to a fixed fraction of the maximum. All following beam sweeps are then referenced to the preceding sweep as far as their trigger threshold is concerned.

In another embodiment of the invention, the workpiece is scanned by the scanning beam successively in opposite directions in equidistant steps, i.e., digitally, and at each start of the raster area a bidirectional counter is started which counts up the scanning steps during the forward sweep of the beam until the marking is reached and counts down during the return sweep until the marking is reached, and the final count of the counter after a full forward and return sweep is used, through a digital-to-analog converter, as the control signal for correcting the position of the workpiece. In this method, the scanning beam is deflected by a triangular-shaped step signal so that the beam is scanned over the workpiece in equidistant steps. A counter is started at the beginning of the forward and the return sweeps and counts the steps until the marking is reached. The difference between the two numbers of steps for the forward and the return sweeps is twice the deviation of the marking from the center of the line scanned, i.e., the desired position. A bidirectional counter which counts up during the forward sweep of the beam and down during the return sweep directly provides the difference between the two numbers of steps and, therefore, a control signal which can be transmitted to a correction system through the digital-to-analog converter.

Figure 3:
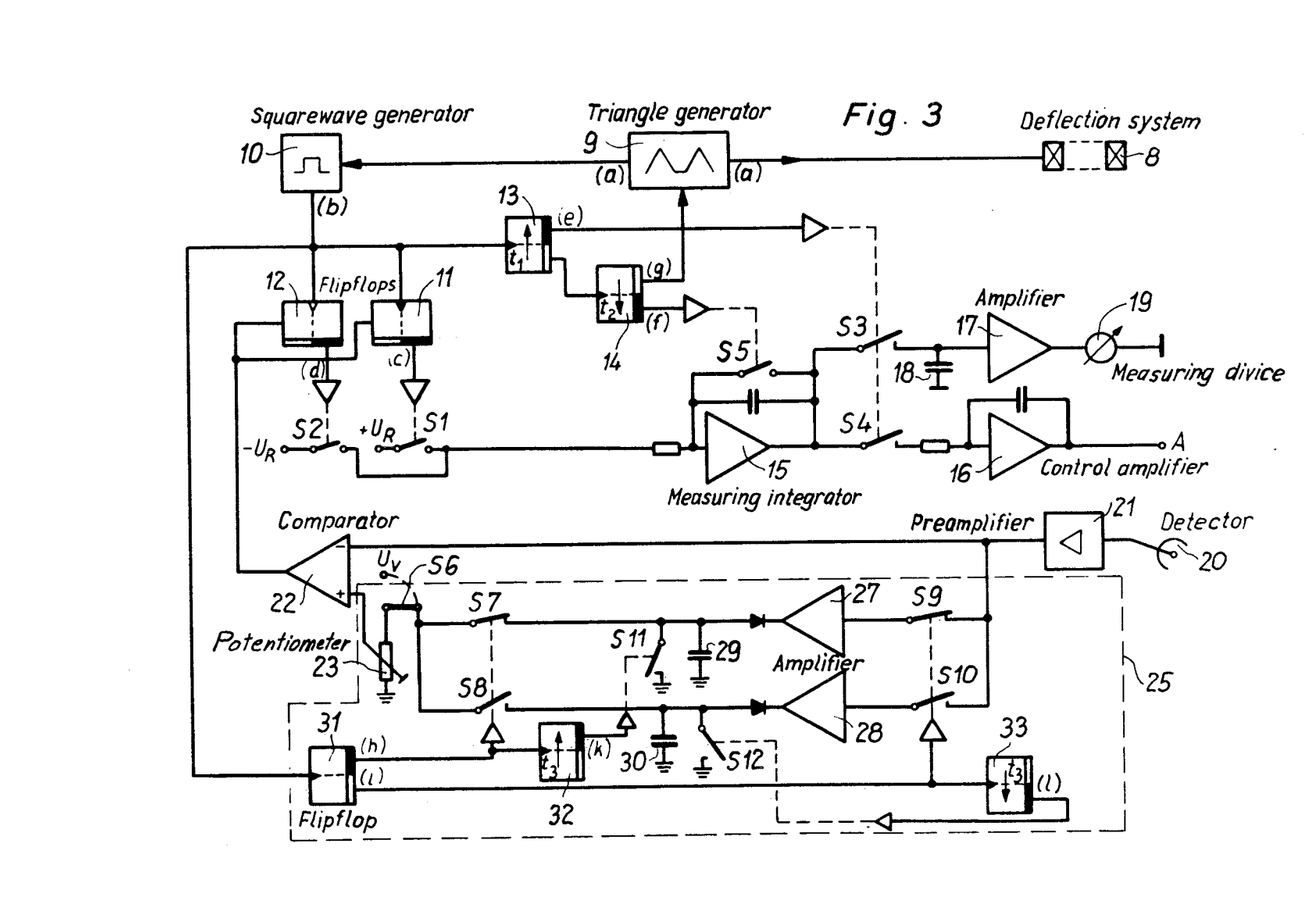
FIG. 3 is one embodiment of an apparatus for automatically positioning a workpiece having at least one marking constructed according to the present invention which is adapted for analog scanning of the workpiece.

FIG. 3 schematically illustrates the circuit of one embodiment of an apparatus for carrying out the automatic positioning method of the invention in which the charged-particle beam scanning the workpiece is deflected by a deflection system 8, which may comprise a magnetic deflection system, as shown in the drawings, or an electrostatic deflection system. The deflection system is driven by a triangle-wave signal generator 9 so that the scanning beam scans the workpiece during its forward sweep at the same velocity as during its return sweep. At the same time, triangle-wave signal generator 9 drives a square-wave signal generator 10 which is at a high voltage level during the falling voltage flanks of the triangle-wave signals generated by generator 9 and during the remaining time is at a low voltage level, for example, at 0 volts. The square-wave generator 10, in turn, drives two bistable multivibrators or flip-flops 11 and 12. Flip-flop 11 couples a positive reference voltage source to a measuring integrator 15 during the rising flank of the signals generated by triangle-wave signal generator 9 by closing a switch S1 coupled to the measuring integrator 15. Integrator 15 integrates this positive reference voltage as long as switch S1 is closed.

A detector 20, for example, a detector which is sensitive to secondary electrons, registers the secondary electrons released by the workpiece during scanning by the beam. The detector signal is amplified by a preamplifier 21 and is transmitted to a comparator 22. In this comparator, the detector signal is compared with a settable d-c voltage which can be generated by a constant voltage source and a voltage divider. If the detector signal voltage exceeds the reference voltage, the comparator (trigger) generates a signal which resets the bistable multivibrator 11 to its initial state. This causes switch S1 to open and the integration of the positive reference voltage $U_R$ by integrator 15 to terminate. During the falling flank of the signal generated by the triangle-wave signal generator, i.e., during the return sweep of the beam, switch S2 is closed and a negative reference voltage $-U_R$ is coupled to integrator 15. This voltage is also integrated until the amplified detector signal exceeds the trigger threshold voltage of comparator 22. The integration value reached at this time is stored until the end of the beam sweep. At the end of the sweep, the square-wave generator jumps back to its low voltage level. This switches the monostable multivibrator 13 which closes switches S3 and S4 for a time period $t_1$. The output signal generated by integrator 15 is applied by means of switch S4 to a control amplifier (storage device) 16 and simultaneously by means of switch S3 to a capacitor 18. The output terminal of the control amplifier 16 is coupled to a workpiece correction system by means of which the exact position of the workpiece relative to the scanning field or to a mask is adjusted. The voltage at capacitor 18 coupled to switch S3 is transmitted by means of an amplifier 17 to a measuring device 19 which indicates the actual deviation of the workpiece from the reference position. After the time period $t_1$, the monostable multivibrator 13 returns to its initial state and thereby switches monostable multivibrator 14 which, for a period of time $t_2$, closes switch S5 connected in parallel relationship to measuring integrator 15 and resets the integrator to zero. Since switches S3 and S4 are now open again, the voltages at control amplifier 16 and at measuring device 19 are not changed. Triangle-wave signal generator 9 is started for a new sweep of the beam simultaneously with the resetting of measuring integrator 15.

In the simplest case, the trigger threshold at comparator 22 is determined by a variable voltage divider 23 and a constant reference voltage source $U_V$. Voltage divider 23 can, however, also be connected by switch S6 to an automatic level adapter device 25 which generates as the reference voltage the respective maximum of the positioning signal. The automatic level adaptation device 25 has two identical parallel branches in which the preamplified detector signal charges capacitors 29 and 30 by means of amplifiers 27 and 28. The capacitor voltage then functions at the reference voltage. A bistable multivibrator (flip-flop) 31 controlled by the square-wave generator 10 controls four switches S7, S8, S9 and S10 so that one capacitor is alternately charged for each full sweep of the beam while the charge voltage of the other capacitor functions as the reference voltage source; for example, switches S7 and S10 are closed during a full sweep, but switches S8 and S9 are open. The bi-stable multivibrator 31 also controls two monostable multivibrators 32 and 33 by means of which a switch S11 or S12, respectively, is closed for a brief period of time $t_3$. This effects discharge of the respective capacitors shunted across switches S11 and S12 before the capacitors are charged again during another beam sweep. Since the trigger threshold is determined by this automatic level adapter device for each sweep of the beam as a fraction of the maximum positioning signal of the preceding sweep, the entire positioning process becomes insensitive to current fluctuations of the scanning beam or drift phenomena in the amplifier electronics.

Figure 4:
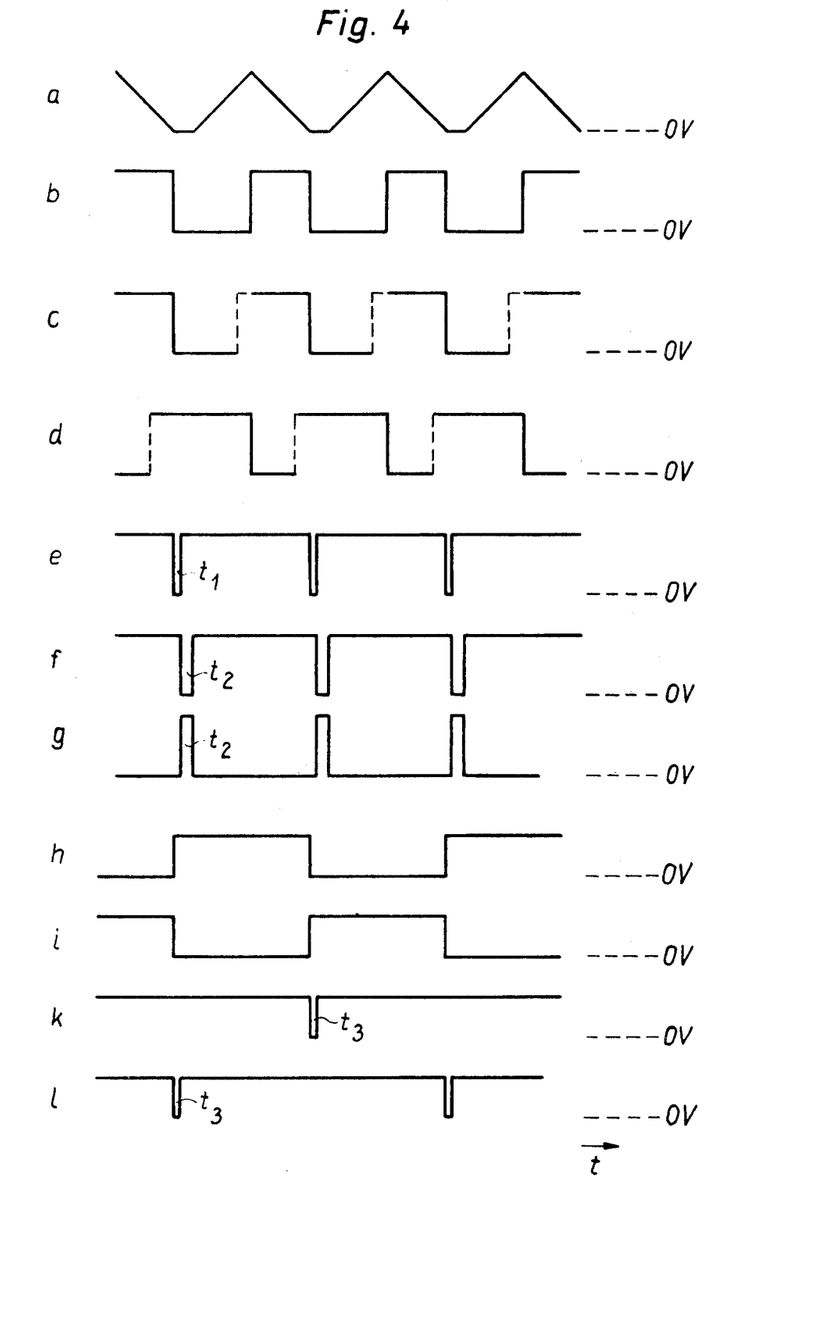
FIG. 4 is a pulse signal diagram of the electrical signals generated at various circuit points in the apparatus of FIG. 3.
Figure 10:
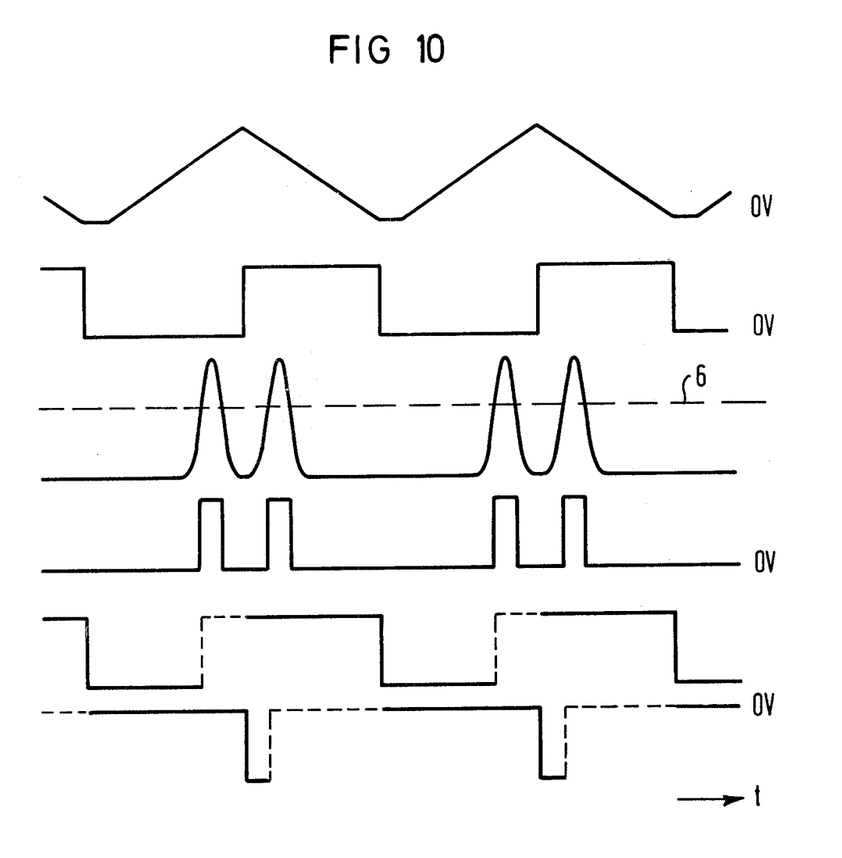
FIG. 10 is an enlarged signal diagram illustrating the time relationships of signals 2a, 2b, 4a, 4b, 4c and 4d shown in FIGS. 2 and 4, respectively.

For a better understanding of the circuit illustrated in FIG. 3, the voltage waveforms at several circuit points, identified by reference letters a through l in FIG. 3, are shown in FIG. 4. Significance is given only to the correlation in time; the voltage amplitude, on the other hand, is set arbitrarily. The dashed lines in the voltage waveforms c and d, which are present at the output terminals of the two bistable multivibrators 11 and 12, indicate that this switching operation can take place at different times, depending on the workpiece position deviation FIG. 10 illustrates the time relationships of signals 2a, 2b, 4a, 4b, 4c and 4d shown in FIGS. 2 and 4, respectively.

Figure 5:
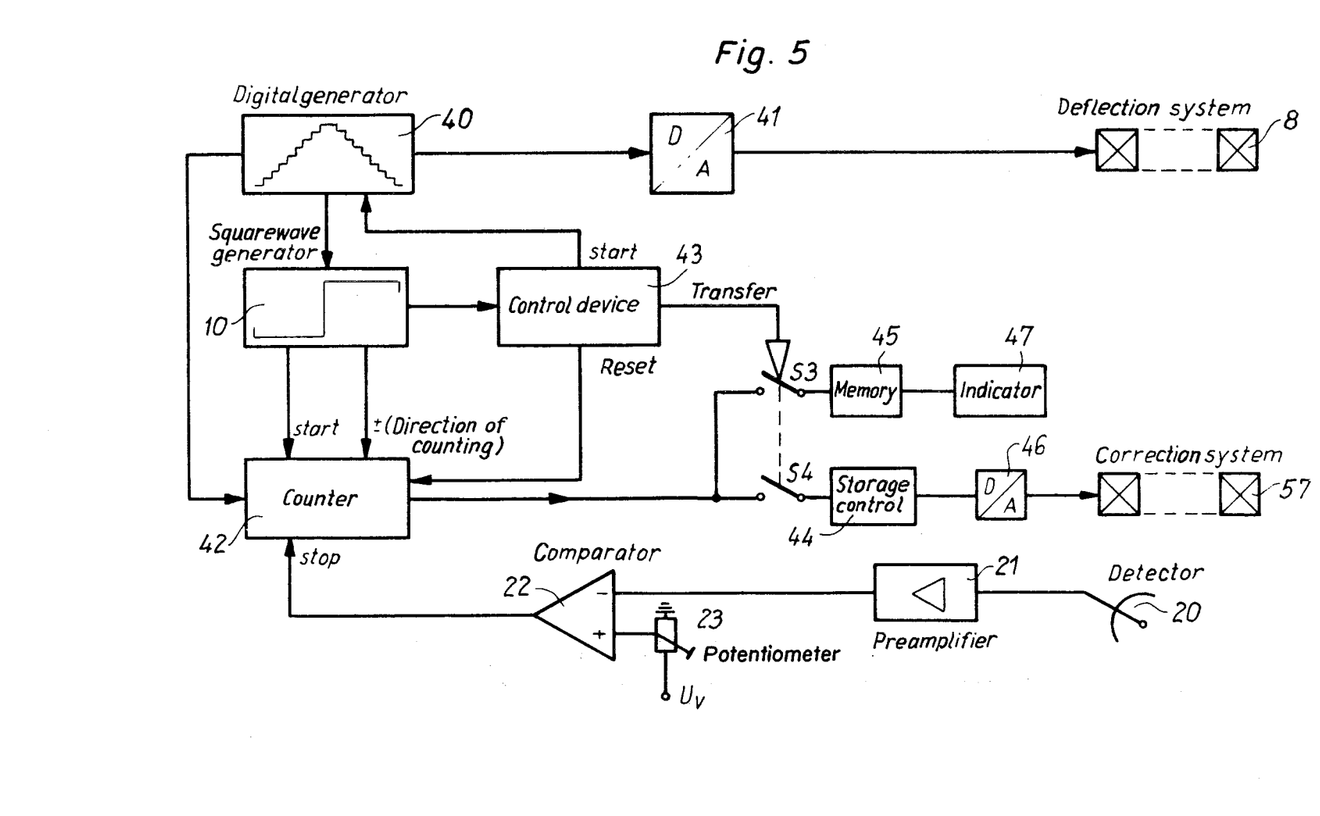
FIG. 5 is another embodiment of an apparatus for automatically positioning a workpiece having at least one marking constructed according to the present invention in which the workpiece is digitally scanned.

FIG. 5 is a block diagram of an automatic positioning device utilizing digital scanning of the workpiece. The deflection system 8 in this apparatus is driven by a digital generator 40 and a digital-to-analog converter 41 and produces stepwise deflection of the scanning beam in equidistant steps. The digital generator 40 simultaneously drives a square-wave generator 10 which starts at its rectangular flanks a bidirectional counter 42 and determines at the same time the direction of counting so that during the forward sweep of the scanning beam, i.e., during the rising flank of the digital generator 40, the scanning steps are counted as positive and during the return sweep, i.e., during the falling flank of the digital generator, the scanning steps are counted as negative. The counter 42 is always stopped upon reaching the corresponding marking signal by the detector 20, the preamplifier 21 and the comparator 22, the trigger threshold of which is set by the reference voltage source $U_V$ and the voltage divider 23. A control device 43 transfers the final count of the counter to a storage control device 44 and a simple memory 45 after each full beam sweep by closing switches S3 and S4. Since the final count of the counter after each full sweep of the scanning beam corresponds to twice the deviation of the marking from the desired, i.e., reference, position, this count value can be used directly as the control signal. The output terminal of the storage control device 44 is coupled by another digital-to-analog converter 46 directly to the workpiece position correction system 57, in this case another magnetic deflection system for the charged-particle beam. Other correction systems such as, for example, adjustment of the stage, can, of course, also be used. The signal in memory 45 is transmitted to an indicating device 47. After the final count of the counter is transferred, counter 42 is reset to zero by the control device 43 and at the same time, digital generator 40 is started for another beam sweep.

Figure 6:
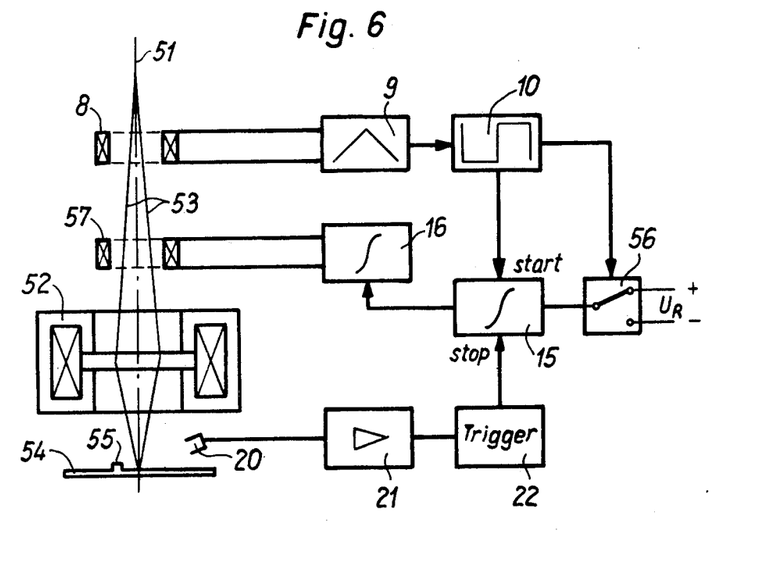
FIG. 6 is a schematic diagram of one embodiment of an electron beam writer for carrying out the method of the present invention.

FIG. 6 illustrates the use of the workpiece positioning method of the invention in an electron beam writer. The electron beam writer, which is diagrammatically illustrated in a simple form, consists of an electron source 51, for example, a thermal cathode or field emission cathode and a lens 52 (in actuality, a lens system) which is excited so that an electron beam 53 emanating from the electron source 51 is focussed on a workpiece 54. A marking 55 is located on workpiece 54, which may comprise a wafer. The electron beam 53 can be scanned in both directions over wafer 54 along a line by means of deflection system 8. An electrostatic deflection unit can also be used for the deflection system instead of magnetic deflection coils. At least one further deflection system not shown is required for deflection of the beam in other directions.

Triangle-wave signal generator 9 drives a square-wave generator 10 and the deflection system 8, which causes a positive reference voltage $U_R$ to be applied to integrator 15 by means of a switch 56 in one scanning direction and a negative reference voltage $-U_R$ to be applied to the integrator in the other scanning direction. The square-wave generator 10 also generates the start signal for integrator 15. The stop signal for integrator 15 is generated by a comparator 22 (trigger) which compares the positioning signal detected by a detector 20 and amplified by a preamplifier 21 with a constant, settable reference voltage. After each sweep of the scanning beam, the integration signal generated by integrator 15 is transmitted to an integrating control device 16 which drives another deflection system 57 for correction of the workpiece position.

If, for example, after a first sweep of the beam, the position deviation is not completely eliminated, i.e., if after the second sweep of the beam an integration value deviating from zero is again obtained in integrator 15, then the latter value is added to the first integration value in the integrating control device 16. The total integration value then determines the correction quantity. This process is repeated until the required workpiece positioning condition is obtained.

This completes the positioning of the workpiece in one direction. In a similar manner, the positioning must be performed subsequently for still at least one other direction, for example, orthogonally with respect to the first direction. For correct angular positioning, another positioning in a third direction may be required.

Figure 7:
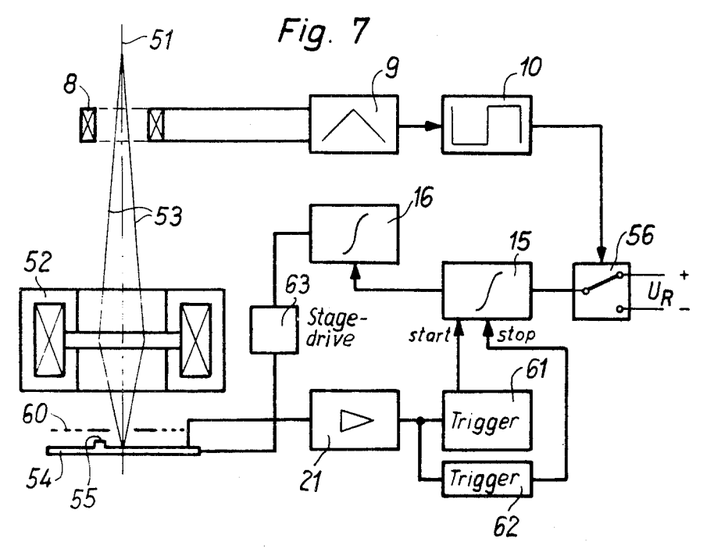
FIG. 7 is a schematic diagram of one embodiment of an electron beam shadow projector for carrying out the method of the present invention.

Referring to FIG. 7, the positioning process for an electron beam shadow projector will now be described. In this process, the workpiece is to be aligned relative to a mask. This projector includes an electron source 51 and an electron lens 52. A projection mask 60 is located immediately above workpiece 54. Not shown in the figure is the integral 1:1 image of the mask 60 onto workpiece 54, for which purpose lens 52 is excited so that electron beam 53 emanating from electron source 51 leaves the lens as an approximately parallel electron beam. The mask is integrally irradiated by this parallel electron beam and is imaged as a shadow projection onto workpiece 54.

In order to position the mask and the specimen relative to each other, lens 52 is excited so that electron beam 53 is focussed on workpiece 54. By means of the deflection system 8, which is driven by the triangle-wave signal generator 9, the electron beam can be deflected in a line scan over workpiece 54 and marking 55. The triangle-wave signal generator 9 also drives the square-wave generator 10 by means of which switch 56 is actuated. In this embodiment, the probe current of the workpiece is used as the positioning signal and is transmitted by means of a preamplifier 21 simultaneously to two triggers 61 and 62. Contrary to the electron beam writer previously described in which the integrator 15 is started by the square-wave generator, the integrator 15 is started in this shadow projector by trigger 61 and the integrator is stopped by trigger 62. The integration thus no longer takes place at the beginning of the forward and return sweep of the scanning electron beam but rather only at the edge of an adjustment opening in the mask 60. Only when this edge is reached will the electron beam pass through the mask and generate, when striking workpiece 54, a probe current signal which exceeds the trigger threshold of trigger 61 and will effect the starting of integrator 15. This probe signal remains at a nearly constant value until the marking is reached and then rises once more, for example, when the marking is reached, so that the trigger threshold of trigger 62 is also exceeded and integrator 15 is stopped again. The output signal of integrator 15 is then transmitted to an integrating control device 16. Since workpiece 54 must be aligned relative to mask 60 in this apparatus, one of these parts must be moved for positioning. The control device 16 therefore operates a stage drive 63 for displacing workpiece 54.

Figure 9:
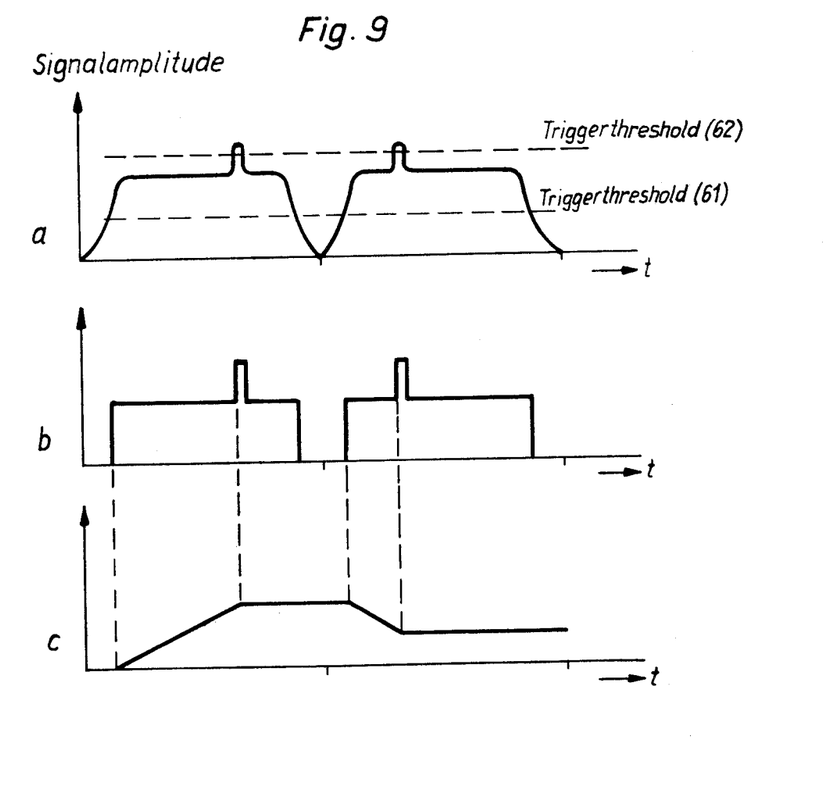
FIG. 9 is a signal diagram illustrating the electrical signals generated by the electron beam shadow projector illustrated in FIG. 7.

FIG. 9 is a signal diagram for the electron beam shadow projector illustrated in FIG. 7. The probe current signal is plotted in FIG. 9a and it can be clearly seen when the edges of the adjustment opening and the marking are reached. The two trigger thresholds are illustrated by the dashed lines. In FIG. 9b, the positioning signal is shown. FIG. 9C shows one possible path of integration.

Figure 8:
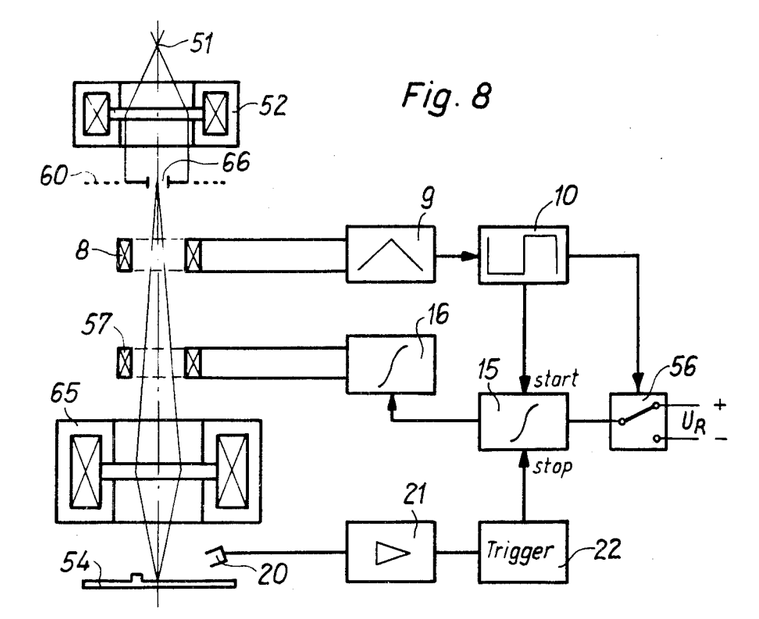
FIG. 8 is a schematic diagram of another embodiment of an electron beam shadow projector for carrying out the method of the present invention.

The positioning method of the invention for another embodiment of an electron beam shadow projector will now be described with reference to FIG. 8. As in the embodiment of the electron beam shadow projector illustrated in FIG. 7, the workpiece 54 is to be aligned relative to a mask 60, but with the difference that an optical imaging system 65 is located between mask 60 and workpiece 54. The workpiece 54 is aligned relative to mask 60 as in the electron beam writer described with reference to FIG. 6 with the sole difference that a scanning probe, as opposed to a point-shaped probe, shaped by a mask marking 66 is used. Instead of a single mask marking 66, several mask markings may be used simultaneously. The positioning signal comprises the radiation emanating from the workpiece, i.e., the secondary electrons or the back scatter electrons. It is equally possible, however, to use the probe current as the positioning signal.

In the embodiments of the charged-particle beam apparatus described, electron beams were used for positioning in accordance with the method of the invention. It should be noted, however, that other charged-particle beams can also be used instead of such electron beams. The method is also suited for positioning using light. In this case, the scanning beam can be deflected for example, by means of a rotating mirror.

The automatic positioning method described herein also makes it possible to monitor the positioning on a monitor and to switch to manual positioning if disturbances occur. For this purpose, the writing beam of the monitor is scanned across the monitor once in each direction of motion of the scanning beam in a given phase relative to the scanning beam in the same direction, and the intensity of the positioning signal is plotted in the direction perpendicular thereto. This generates two positioning signals, shown in FIG. 1b. If the workpiece positioning is exact, these two images coincide.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly to be regarded in an illustrative rather than in a restrictive sense.

What is claimed is:

1. In a method for automatically positioning a workpiece having at least one marking, specifically a wafer for integrated circuits which is to be processed in a charged-particle beam apparatus, relative to a scanning field or mask, in which a scanning beam scans the workpiece along a line and a marking signal is generated when the marking is reached by the beam, said marking signal controlling a device which generates a control signal in response to the marking signal, said control signal being proportional to the deviation of the marking position from a reference position and driving a device for correcting the position of the workpiece relative to the scanning field or mask, the improvement comprising the steps of scanning the workpiece by the scanning beam successively in opposite directions at the same velocity through a forward sweep and a return sweep;

integrating a positive reference voltage in an integrator during said forward sweep of said beam from the beginning of the line scanned until the marking on said workpiece is reached by said beam;

integrating a negative reference voltage having the same magnitude as said positive reference voltage in said integrator during said return sweep of said beam from the end of the line scanned by said beam until the marking on said workpiece is reached by said beam; and generating an output control signal by means of said integrator after a full forward and return sweep of said scanning beam over said workpiece for correcting the position of said workpiece relative to said scanning field or mask.

2. The method recited in claim 1, wherein said charged-particle beam apparatus comprises a charged-particle beam writer.

3. The method recited in claim 1, wherein said charged-particle beam apparatus comprises a charged-particle beam shadow projector and wherein the length of the line scanned by said scanning beam is determined by the size of an adjustment opening in a mask in said apparatus.

4. The method recited in claim 1, wherein said charged-particle beam apparatus comprises a charged-particle beam microprojector.

5. In a method for automatically positioning a workpiece having at least one marking, specifically a wafer for integrated circuits which is to be processed in a charged-particle beam apparatus, relative to a scanning field or mask, in which a scanning beam scans the workpiece along a line and a marking signal is generated when the marking is reached by the beam, said marking signal controlling a device which generates a control signal in response to the marking signal, said control signal being proportional to the deviation of the marking position from a reference position and driving a device for correcting the position of the workpiece relative to the scanning field or mask, the improvement comprising the steps of digitally scanning said workpiece by said scanning beam successively in opposite directions through a forward sweep and a return sweep in equidistant steps;

counting said scanning steps of said beam in a bidirectional counter at the beginning of each line scanned during said forward sweep of said beam until said marking on said workpiece is reached by said beam, and down-counting said scanning steps in said counter from the end of each line scanned during said return sweep of said beam until said marking on said workpiece is reached; and transmitting the final count of said counter after a full forward and return sweep of said scanning beam to a digital-to-analog converter and generating an output control signal by means of said converter in response to said count for correcting the position of said workpiece relative to said scanning field or mask.

6. The method recited in claim 1 or 5, wherein a rectangular-shaped output control signal, the width of which depends upon the setting of a trigger threshold, is generated in response to said marking signal for positioning said workpiece, and wherein said method further comprises the step of indicating when said marking on said workpiece is reached by the flanks of said rectangular-shaped output control signal.

7. The method recited in claim 6, wherein said trigger threshold is determined as a fraction of the maximum amplitude of the marking signal during each sweep of said scanning beam for the following sweep of said beam.

8. An apparatus for automatically positioning a workpiece having at least one marking, specifically a wafer for integrated circuits which is to be processed in a charged-particle beam apparatus, relative to a scanning field or mask, which workpiece is scanned by a scanning beam along a line and a marking signal is generated when the marking is reached by the beam, said marking signal controlling a device which generates a control signal in response to the marking signal, said control signal being proportional to the deviation of the marking position from a reference position and driving a device for correcting the position of the workpiece relative to the scanning field or mask, comprising a triangle-wave signal generator;

a beam deflection system coupled to said triangle-wave signal generator for deflecting said scanning beam to scan said workpiece in successively opposite directions at the same velocity through a forward sweep and a negative sweep;

a square-wave signal generator coupled to said triangle-wave signal generator;

first and second d.c. voltage sources for generating first and second d.c. voltages having the same magnitude but opposite polarity;

first and second bistable multivibrators coupled to said square-wave signal generator;

first and second switch means coupled to said first and second d.c. voltage sources and adapted to be controlled by said first and second bistable multivibrators;

an integrator coupled to said first and second d.c. voltage sources by means of said first and second switch means;

first and second series-connected monostable multivibrators coupled to said square-wave signal generator;

third and fourth switch means coupled to said integrator and adapted to be controlled by said series-connected monostable multivibrators so as to briefly close sequentially after a sweep of said scanning beam across said workpiece and first couple an output terminal of said integrator to a storage control device coupled thereto which generates an output control signal for correcting the position of said workpiece and subsequently short-circuit said integrator, said monostable multivibrators causing said triangle-wave signal generator to generate a signal for another sweep of said beam simultaneously with said short-circuiting of said integrator;

a detector for registering said marking signal;

a preamplifier coupled to said detector; and a comparator coupled to said preamplifier and to said first and second bistable multivibrators, said comparator being further coupled to means for setting a trigger threshold for said comparator including a reference voltage source and a voltage divider, said preamplifier and said comparator transforming said marking signal into a control signal for controlling said first and second bistable multivibrators.

9. An apparatus for automatically positioning a workpiece having at least one marking, specifically a wafer for integrated circuits which is to be processed in a charged-particle beam apparatus, relative to a scanning field or mask, which workpiece is scanned by a scanning beam along a line and a marking signal is generated when the marking is reached by the beam, said marking signal controlling a device which generates a control signal in response to the marking signal, said control signal being proportional to the deviation of the marking position from a reference position and driving a device for correcting the position of the workpiece relative to the scanning field or mask, comprising

- a digital signal generator;
- a digital-to-analog converter coupled to said digital signal generator;
- a beam deflection system coupled to said digital-to-analog converter for deflecting said beam in a linear scan across said workpiece in equidistant steps;
- a square-wave signal generator coupled to said digital signal generator;
- a bidirectional counter, coupled to said square-wave signal generator and to said digital signal generator, for counting said scanning steps of said beam, said square wave generator controlling the direction and the start of counting by said bidirectional counter;
- a control device coupled to said square-wave signal generator, said digital signal generator, and said counter;
- switch means coupled to said counter and adapted to be controlled by said control device, said control device closing said switch means after a full forward and return sweep of said scanning beam;
- a storage control device, coupled to said switch means, the final count of said counter being transmitted to said storage device when said switch means is closed by said control device;
- a digital-to-analog converter, coupled to said storage control device, for generating an output control signal in response to said final count and correcting the position of said workpiece, said control device resetting said counter to zero after said final count of said counter is transmitted to said storage control device and restarting said digital signal generator for another sweep of said scanning beam;
- a detector for registering said marking signal;
- a preamplifier coupled to said detector; and
- a comparator coupled to said preamplifier and to said counter, said comparator being further coupled to means for setting a trigger threshold for said comparator including a reference voltage source and a voltage divider, said preamplifier and said comparator transforming said marking signal into a control signal for stopping said counter.

10. The apparatus recited in claim 8 or 9, wherein said means for setting said trigger threshold for said comparator further includes first and second capacitors,
a bistable multivibrator coupled to said capacitors and to said square-wave signal generator,
a plurality of switch means adapted to be controlled by said bistable multivibrator and coupled to said detector and to said voltage divider, said bistable multivibrator connecting said plurality of switch means alternately during one of said beam sweep to said detector and to said voltage divider,
third and fourth monostable multivibrators coupled to said bistable multivibrator, and
third and fourth switch means coupled to said capacitors and adapted to be controlled by said third and fourth monostable multivibrators for short-circuiting said capacitors.

* * * * *